United States Patent
Chang

[11] Patent Number: 6,037,263
[45] Date of Patent: Mar. 14, 2000

[54] PLASMA ENHANCED CVD DEPOSITION OF TUNGSTEN AND TUNGSTEN COMPOUNDS

[75] Inventor: Liang-Tung Chang, Hsinchu, Taiwan

[73] Assignee: Vanguard International Semiconductor Corporation, Hsin-Chu, Taiwan

[21] Appl. No.: 09/186,391

[22] Filed: Nov. 5, 1998

[51] Int. Cl.[7] .................................................. H01L 21/00
[52] U.S. Cl. .......................... 438/712; 438/694; 438/720; 438/721; 438/742; 438/692
[58] Field of Search ..................... 427/533, 564, 427/569, 576; 438/229, 233, 692, 694, 675, 696, 712, 720, 721, 742; 216/67, 37, 75

[56] References Cited

U.S. PATENT DOCUMENTS

| | | | |
|---|---|---|---|
| 4,692,343 | 9/1987 | Price et al. | 427/38 |
| 4,838,990 | 6/1989 | Jucha et al. | 156/643 |
| 4,874,723 | 10/1989 | Jucha et al. | 437/245 |
| 5,028,565 | 7/1991 | Chang et al. | 437/192 |
| 5,164,330 | 11/1992 | Davis et al. | 438/720 X |
| 5,407,698 | 4/1995 | Emesh | 427/99 |
| 5,591,486 | 1/1997 | Okano et al. | 427/255.2 |
| 5,747,383 | 5/1998 | Chen et al. | 438/720 X |
| 5,753,533 | 5/1998 | Saito | 438/720 |

OTHER PUBLICATIONS

S. Wolf, "Silicon Processing for the VLSI Era" vol. 2, Lattice Press, Sunset Beach, CA, 1990, p247, 398.

Primary Examiner—William Powell
Attorney, Agent, or Firm—George O. Saile; Stephen B. Ackerman

[57] ABSTRACT

A method for plasma assisted CVD deposition of tungsten and of tungsten compounds is described wherein a plasma containing a high density of active hydrogen species is maintained to scavenge fluorine and fluoride species formed by the decomposition of the tungsten precursor $WF_6$. The activated hydrogen species also assist in the breaking of W—F bonds, thereby facilitating the decompoition process and forming high density, high conductivity, fluoride free conductive films of tungsten and of tungsten compounds. The ability to form such fluoride free tungsten films with the assistance of activated hydrogen species, permits the deposition of tungsten directly onto gate oxides thereby enabling the formation of tungsten gate electrodes without underlying polysilicon. Low conductivity tungsten contacts including in-situ formed tungsten compound barrier layers may also be formed by this process.

29 Claims, 3 Drawing Sheets

PLASMA ENHANCED CVD DEPOSITION OF TUNGSTEN AND TUNGSTEN COMPOUNDS

BACKGROUND OF THE INVENTION (1) Field of the Invention

The invention relates to processes for the manufacture of semiconductor devices and more particularly to processes for forming gate electrodes and contact metallization to self-aligned-gate field effect transistors.

(2) Background of the Invention and Description of Prior Art

Refractory metals and their suicides have found widespread use in the manufacture of very large scale integrated circuits. Tungsten(W), in particular, because of its chemical stability and its ease of film formation by chemical vapor deposition(CVD), is used extensively for the formation of electrical contacts to silicon device elements. Tungsten silicide($WSi_2$) is frequently selectively formed over exposed silicon surfaces by depositing a tungsten layer, annealing to react the layer with the silicon areas and etching away the unreacted tungsten, leaving tungsten silicide only on the silicon.

As a conductive material tungsten does not rank as high as aluminum, which has been the primary conductor used in micro-circuit chip technology for nearly forty years. On the other hand, tungsten and some of its compounds offer many features which make them important materials for fabricating metal-to-silicon contacts, via plugs, polycide gate electrodes, and intra/inter-level interconnects. CVD tungsten has low stress (less than $5 \times 10^9$ dynes/cm$^2$), a coefficient of thermal expansion which closely matches that of silicon, and a high resistance to electromigration which is a common problem with aluminum its alloys. CVD tungsten can be deposited at temperatures around 400° C. using the hydrogen or silane reduction of tungsten hexafluoride($WF_6$) with good conformity and step coverage.

Over time the art of tungsten deposition has been developed to provide optimal combinations of properties for specific applications. In many instances this has resulted in making combined use of both the hydrogen and silane reduction process as well as performing the deposition in stages whereby such factors as adhesion, grain structure, edge coverage, sheet resistance and stress are balanced to provide high quality tungsten contact plugs and interconnects. Emesh, U.S. Pat. No. 5,407,698 and Chang, et.al. U.S. Pat. No. 5,028,565 cite examples of such optimizations, wherein the gas flows introduced into the reactor contain both hydrogen and silane. The fluorine containing species produced by the reduction of $WF_6$ to form tungsten conductive films have heretofore made their application directly onto gate oxides impractical. Gate oxides exposed to these species are seriously degraded not only by fluoride incorporation into the oxide but also by fluorine induced oxide deterioration.

When W is deposited into contact openings adjacent to silicon oxide gate layers, the HF by-product of the hydrogen reduction process is believed to be responsible for problems of encroachment under the oxide as well as for wormholes which lead to junction leakage. This is discussed by Wolf, S., "Silicon Processing for the VLSI Era", Vol.2, Lattice Press, Sunset Beach, Calif., (1990), p.247. In addition residual fluorides left by the W deposition can become corrosive to nearby metal films such as aluminum. Although HF is not directly formed by the silane reduction reaction, the hydrogen by-product can subsequently react with $WF_6$ to form it.

Generally, metal layers are deposited either by physical vapor deposition(PVD) method such as sputtering or vacuum evaporation or by low pressure CVD (LPCVD) or Atmospheric pressure CVD (APCVD). Recent efforts have been successful in depositing metals such as aluminum and copper from metal-organic precursors using metal-organic CVD (MOCVD). Tungsten and molybdenum gate electrodes have been formed by magnetron sputtering as reported by Wolf, S., "Silicon Processing for the VLSI Era", Vol.2, Lattice Press, Sunset Beach, Calif., (1990), p398. These materials have significantly lower conductivities than polysilicon or polycide gates.

Price, U.S. Pat. No. 4,692,343 cites the formation of tungsten silicide by a plasma enhanced CVD (PECVD) process using tungsten hexafluoride ($WF_6$) and dichlorosilane ($SiH_2Cl_2$). The apparatus consists of an ante-chamber in which a plasma is ignited and a chamber in which deposition takes place. The plasma discharge is applied only to initiate deposition of tungsten silicide. Sustaining the plasma past the initial period was found to be detrimental to the deposition. The problem with this reactor configuration is that sustaining a plasma would cause film deposition over the walls of the upper chamber thereby depleting the reactant gas as well as contaminating the chamber. Thus plasma activated species would not be available during the film deposition period.

Jucha, in U.S. Pat. No. 4,838,990 shows a method for plasma etching tungsten and in U.S. Pat. No. 4,874,723 shows a process of etching tungsten by remote and in-situ plasma generation. Besides relating only to etching, there is no involvement of active hydrogen species for abatement of fluoride contamination. Okano, U.S. Pat. No. 5,591,486 describes a method for depositing a film using a CVD deposition chamber with an attached remote chamber. One film precursor gas is introduced into the remote chamber to be activated by microwaves while a second precursor gas enters directly into the deposition chamber.

SUMMARY OF THE INVENTION

It is an object of this invention to provide a method for deposition of films of tungsten and of tungsten compounds with low fluoride content.

It is another object of this invention to provide a method of reducing fluoride contamination of gate oxides during the formation of films of tungsten and of tungsten compounds.

It is yet another object of this invention to provide a method for forming gate electrodes of tungsten and of tungsten compounds by PECVD of these materials directly onto gate oxides without contaminating the gate oxide with reaction by products or otherwise compromising it's quality.

These, and other objects which will become apparent, are accomplished by providing a high density of activated hydrogen species in the deposition chamber of a parallel plate PECVD reactor before and during the deposition of the tungsten and tungsten compound films. The presence of a high density of activated hydrogen radicals during film deposition is a key feature of this invention. A wafer, upon which a film is to be deposited is placed in the deposition chamber and brought to a the desired deposition temperature. A flow containing hydrogen is introduced and the hydrogen is activated by striking a plasma in the chamber. After a period of time precursors for the formation of tungsten or of tungsten compounds are admitted into the reaction chamber, while still maintaining the activated hydrogen gas flow. Films of tungsten or of tungsten compounds are then deposited in the presence of activated hydrogen species.

The active hydrogen has the effect of first preparing the surface of the wafer by removing native oxide films and detaching adsorbed contaminants. During subsequent film deposition, the continued presence of activated hydrogen species aids in the removal of fluorides by binding or otherwise scavenging fluorine species, thereby inhibiting the incorporation of these fluorides into the deposited layers or into other existing structures. In addition the activated hydrogen is believed to assist in breaking down the tungsten precursor $WF_6$ by providing energy to dissociate the W—F bonds, thereby carrying away fluorine while still in the gas phase.

Tungsten cr tungsten compound films may be deposited over gate oxides and subsequently patterned to form high quality gate electrodes which have improved conductivity over conventional polysilicon gate electrodes. Because of the assistance of plasma activated hydrogen species both before and during the deposition, the gate oxides are not contaminated by CVD by products and are in fact cleaned and improved.

Tungsten compound films which may be deposited by the process of this invention include carbides, silicides, and nitrides. These tungsten compounds may not only be applied as gate electrode materials but are also effective as adhesion/barrier layer materials for tungsten or other metallic plug contacts.

It is yet another object of this invention to provide a method for in-situ removal of native oxide films and contaminants from silicon and polysilicon surfaces prior to deposition of tungsten and tungsten silicide films thereby reducing contact resistance and improving contact reliability.

It is another object of this invention to provide a method for in-situ removal of contaminants from gate oxide films prior to the deposition of a gate conductive material.

This object is accomplished by subjecting the silicon and polysilicon surfaces to an in-situ surface cleaning using plasma activated hydrogen immediately prior to the deposition of tungsten and tungsten suicide films.

It is yet another object of this invention to provide a method for providing a continuous in-situ purification of a conductive layer during it's deposition by effective removal of reaction by-products and other contaminants.

This object is accomplished by maintaining a continuous presence of a high concentration of plasma activated hydrogen species in the region of the depositing film during the entire deposition period. In the preferred embodiment the active hydrogen species are generated by rf energy within the deposition chamber of an PECVD reactor. A commercial HDP(high density plasma) parallel plate reactor, fitted with a heated substrate holder is preferred. Alternately, active hydrogen species may be generated in a remote chamber by rf or microwave activation and injected into the chamber of an LPCVD reactor.

DESCRIPTION OF THE PREFERRED EMBODIMENTS

In a preferred embodiment of this invention a self-aligned gate MOSFET is formed implementing tungsten and tungsten compounds for the conductive components of the device. The process of the invention is first implemented to form a tungsten gate electrode directly on the MOSFET gate oxide. Tungsten and tungsten compounds are then applied according to the method of the invention to form conductive contacts to the gate and the semiconductive elements of the device.

Figure 1:
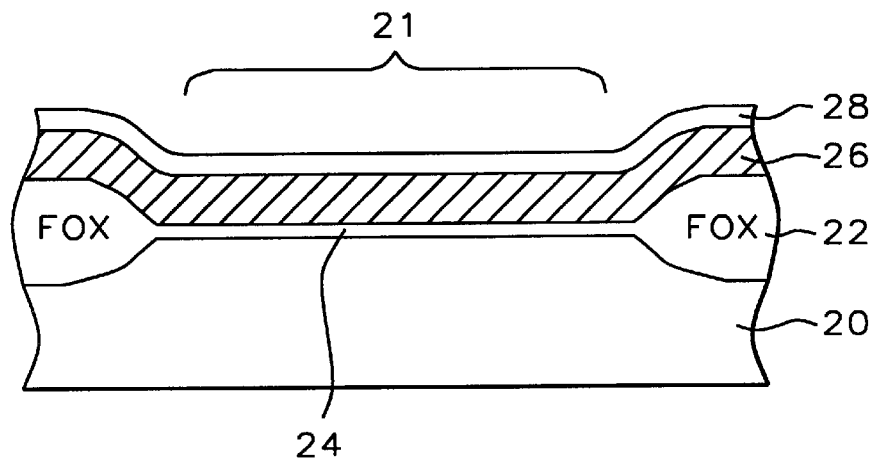
FIG. 1 through FIG. 6 are cross sections of a an in-process silicon wafer illustrating the formation of a self-aligned tungsten gate MOSFET using the processing methods taught by the current invention.

An monocrystalline silicon wafer is provided. Referring to FIG. 1 there is shown a cross section of a wafer 20 in which a self-aligned gate MOSFET is to be been formed. A field oxide region (FOX) 22 is formed by the well known method of local oxidation of silicon (LOCOS) to define the region 21 wherein the MOSFET device is to be formed. A gate oxide 24 is next grown over the active region by thermal oxidation.

After the gate oxide is formed the wafer 20 is mounted onto the substrate support in the deposition chamber of a PECVD reactor. The reactor is preferably of the HDP parallel plate type, having a heated substrate holder. The deposition chamber is evacuated and the wafer 20 is brought to a temperature of between about 50 and 800° C. by a heater in the substrate support. A gas flow containing $H_2$ at a flow rate of between about 50 and 3,000 SCCM(standard cubic centimeters per minute) then is admitted into the deposition chamber. The gas flow is adjusted to maintain a pressure of between about 0.3 and 10 Torr. A plasma containing activated hydrogen radicals is struck by the application of rf energy and maintained for a period of between about 2 and 10 seconds to remove adsorbed contaminants from the gate oxide 24 surface in preparation for the deposition of a conductive layer from which a gate electrode will be patterned.

After the brief surface treatment with activated hydrogen, and while maintaining a plasma discharge in the deposition chamber a gas flow containing $WF_6$ and $SiH_4$ is admitted to the reaction chamber, preferably through a second chamber port. The substrate temperature is controlled at between about 300 and 600° C. and a layer of tungsten is deposited over the wafer 20. By varying the respective flow rates of $WF_6$ and $SiH_4$, the composition of the film may be adjusted to contain more or less $WSi_2$.

Alternately, other gases may be used in place of $SiH_4$ to modify the composition of the conductive layer to contain or to consist entirely of tungsten carbides, tungsten silicides or tungsten nitrides. Suitable gases include $N_2$, and $NH_3$ for the formation of tungsten nitrides and hydrocarbons, for example $CH_4$ and $C_2H_6$, to form conductive layers containing tungsten carbides. These gases are preferably admitted to the PECVD reactor in the same flow stream whereby the $H_2$ is admitted. The flow rates for these gases are between about 50 and 3,000 SCCM and must be determined by experiment in order to obtain the desired conductive layer composition. The chamber pressure is maintained at between about 0.3 and 10 Torr by adjustment of a throttle valve in the pumping port of the reactor.

Under these conditions a tungsten containing conductive layer 26 between about 150 and 250 nm thick is deposited over the gate oxide 24. A cap insulative layer 28 is next deposited over the conductive layer 26. The cap layer may be formed either of silicon oxide, silicon nitride, or other suitable insulative material and is deposited by well known conventional CVD deposition methods. The cap layer 28 is applied to prevent gate-to-source/drain shorts if self-aligned contacts are employed. In the present embodiment self-aligned contacts are not used so the cap layer 28, although included, is optional.

Figure 2:
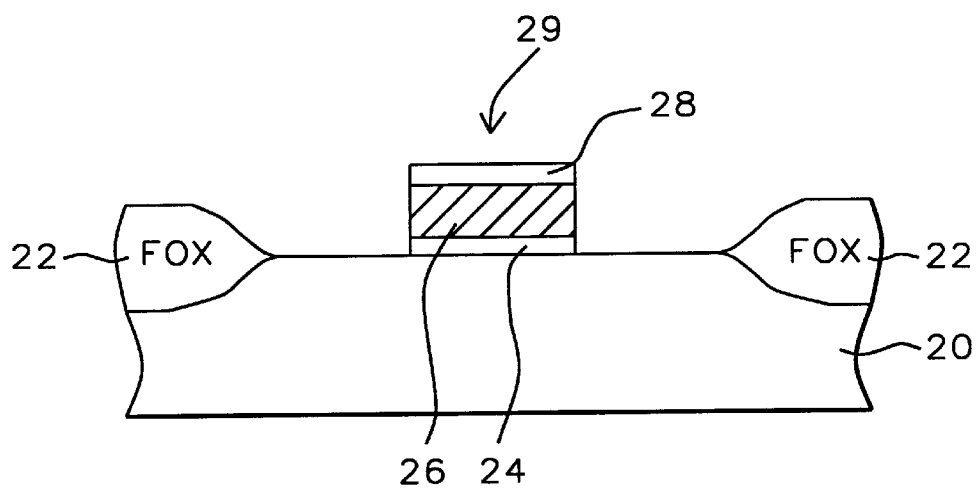
Figure 3:
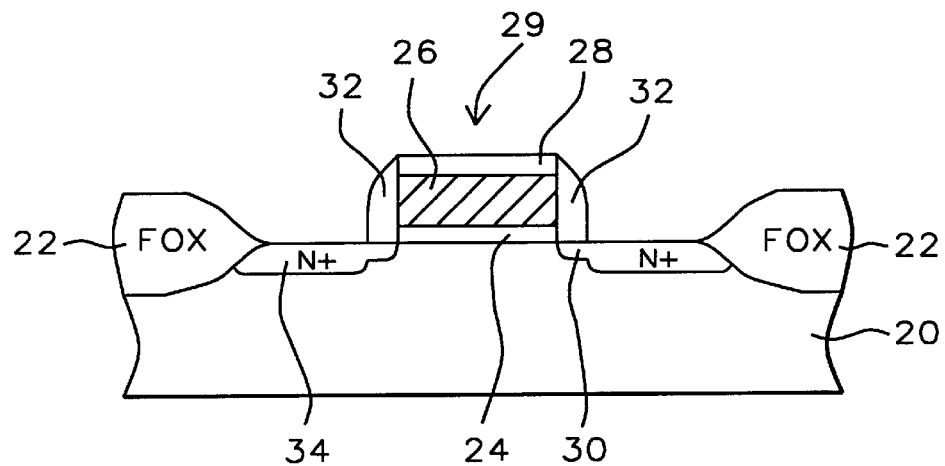

Referring next to FIG. 2, the gate stack 29 is defined by photolithographic processing and etched by reactive ion etching using well known etchants and established procedures. Lightly doped drain (LDD) elements 30 are then formed by ion implantation of a dopant material using well established and widely practiced ion implantation methods FIG. 3 is a cross section of the MOSFET device after completion of the LDD processing. The LDD portion of the source/drain diffusion 30 is formed prior to the formation of the sidewall structure 32 and a heavier doped portion 34, to which contacts are subsequently applied is formed by a second ion implantation using the sidewall 32 as a mask. The sidewalls 32 are formed by depositing an insulative layer, for example silicon oxide or silicon nitride and then anisotropically etching the layer back by RIE leaving the sidewall portions 32.

Figure 4:
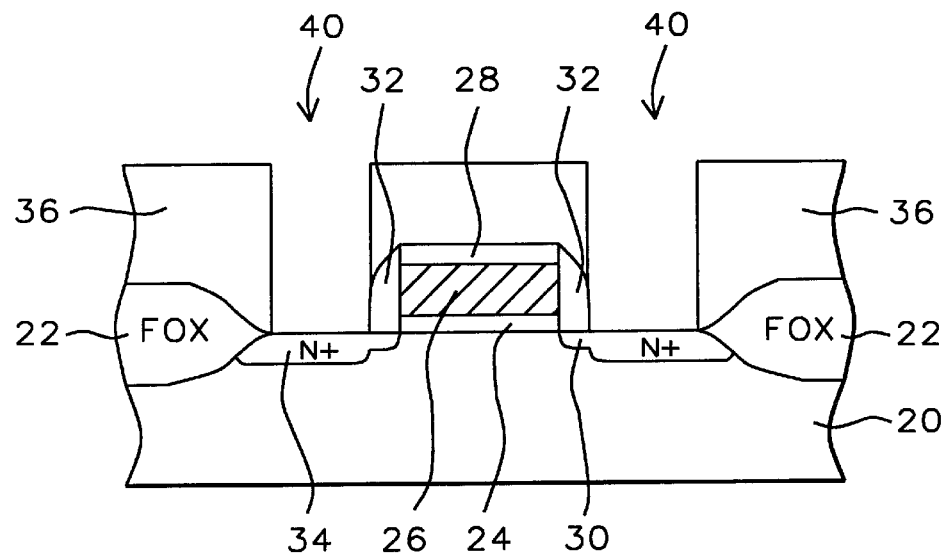

Referring next to FIG. 4, an insulative layer 36, preferably of a silicate glass, for example, a borophoshosilicate glass (BPSG or BPTEOS), is deposited by LPCVD or PECVD using procedures well known by those in the art. The layer 36 is planarized, for Example by flowing the glass or by chemical mechanical polishing(CMP), to abate surface topographic features and patterned with conventional photolithographic techniques to define contact openings 40. In addition to the contact openings 40 shown in the cross section of FIG. 5, there is also a contact opening to the gate electrode 26 located elsewhere on the wafer and not in the plane of the cross section, preferably at a point where the gate electrode 26 passes over a region of field oxide 22.

Figure 5:
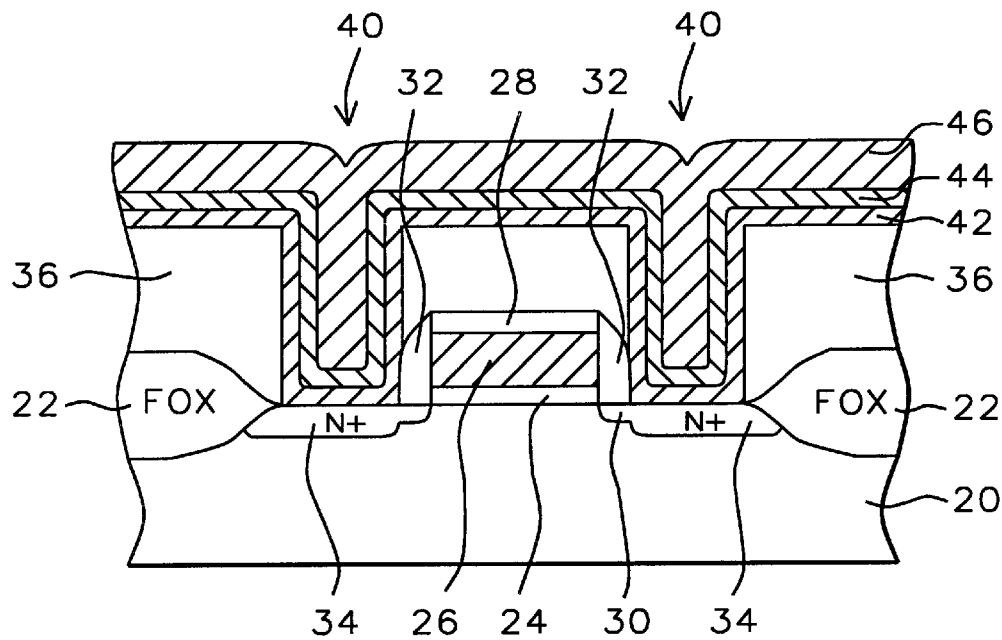

Referring to FIG. 5, a thin conformal layer 42 of $WSi_2$ is next deposited into the contact openings 40 by the method of this invention. The wafer 20 is again mounted onto the substrate support of the PECVD reactor used to deposit the gate electrode 26 and described hereinbefore. The reactor chamber is evacuated and the wafer 20 is then brought to a temperature of between about 200 and 600° C. A gas flow containing $H_2$ at a flow rate of between about 500 and 3,000 SCCM and is begun. The gas flow is adjusted to maintain a pressure of between about 0.3 and 10 Torr in the reactor chamber. A plasma is struck forming activated hydrogen radicals within the reactor chamber and maintained for a period of between about 2 and 10 seconds. During this period of time any native oxide layer which may have formed on the exposed silicon surface at the base of the contact openings 40 is removed and a clean silicon surface is presented for receiving a $WSi_2$ layer 42 which is next deposited without breaking vacuum.

$SiH_4$ is next admitted to the hydrogen gas flow. The $SiH_4$ flow rate is maintained at about 300 SCCM and the $H_2$ flow rate is maintained at between about 500 and 3,000 SCCM At the same time a flow of the tungsten precursor $WF_6$ is begun at a flow rate of between about 3 and 300 SCCM. The gas flow is adjusted by mean of a throttle valve located in the pumping port of the reactor to maintain a chamber pressure of between about 0.3 and 10 Torr. An inert carrier gas of argon or helium may also be used to achieve the desired chamber pressure. Under these conditions a conformal layer of $WSi_2$ 42 approximately 10 to 20 nm thick deposited in the contact openings and over the surface of the dielectric layer 36. The $Si/WSi_2$ interface at the base of the openings 40, having been in-situ cleaned prior to the $WSi_2$ deposition, is of a low resistance and thereby forms an excellent ohmic contact to the semiconductor element. In addition, the high concentration of hydrogen active species present during the $WSi_2$ deposition reduces the incorporation of fluorine in the spacer 32 and the exposed gate oxide 24 regions thereby suppressing gate oxide degradation.

The $SiH_4$ component in the gas flow is next halted and replaced by a $NH_3$ flow of between 200 and 300 SCCM. A layer of tungsten nitride 44 is thereby deposited over the $WSi_2$ layer 42 to form a barrier to prevent tungsten spiking into the silicon. The tungsten nitride layer 44 is grown to a thickness of between about 20 and 50 nm. Alternately, nitrogen may also be used to form the tungsten nitride layer 44.

Following the deposition of the tungsten nitride layer 44, the gas flow is again altered to deposit a W layer 46 which fills the openings 40. Deposition of the W layer 40 is next accomplished without breaking vacuum and without interrupting the hydrogen flow or the application of rf power. The wafer 20 is maintained at a temperature of between about 200 and 600° C. during the W deposition. A gas flow containing $SiH_4$ at a flow rate of about 200 SCCM or less and $WF_6$ at a flow rate of between about 10 and 200 SCCM is administered for a period of time to completely fill the contact openings and leave an essentially planar surface. The chamber pressure during the W deposition is adjusted to between about 10 and 100 Torr by adjusting the throttle valve and by adding an inert carrier gas.

Figure 6:
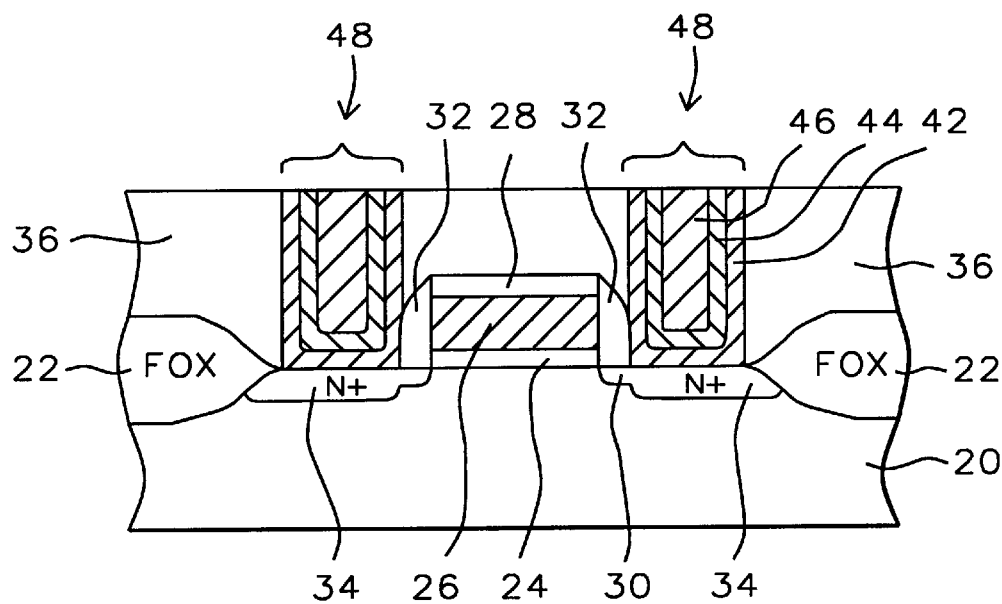

Referring next to FIG. 6, the W layer 46, tungsten nitride layer 44, and the tungsten silicide layer 42 are then etched back by RIE with, for example, $SF_6$ and $C_2F_6$, thereby forming tungsten plug contacts 48 to the semiconductive elements 34.

While the embodiment forms a tungsten plug contact having a barrier layer 44 of tungsten nitride between the tungsten layer 46 and the silicon 34, the method of the invention could also be employed to form a tungsten carbide layer within the contact opening over the $WSi_2$ layer 42 by replacing the $SiH_4$ in the gas flow by $CH_4$, $C_2H_6$ or other hydrocarbon gas. The barrier layer 44 could be formed over the $WSi_2$ layer 42 or could be formed directly onto the silicon 32 without first forming the $WSi_2$ layer 42.

While the invention has been particularly shown and described with reference to the preferred embodiments thereof, it will be understood by those skilled in the art that various changes in form and details may be made without departing from the spirit and scope of the invention.

What is claimed is:

1. A method of forming a tungsten gate electrode for a self-aligned gate MOSFET on a silicon wafer comprising:
    (a) providing a silicon wafer;
    (b) forming a field oxide on said silicon wafer wherein said field oxide is patterned to define a silicon active area;
    (c) forming a gate oxide on said active area;
    (d) mounting said silicon wafer on a substrate support in a deposition chamber of a parallel plate plasma enhanced chemical vapor deposition reactor;
    (e) heating said silicon wafer;
    (f) flowing a first gas mixture containing $H_2$, through said plasma enhanced chemical vapor deposition reactor;
    (g) striking an rf glow discharge in said plasma enhanced chemical vapor deposition reactor a time period thereby forming a plasma containing active hydrogen species;
    (h) after said time period, and while maintaining said glow discharge, flowing a second gas mixture containing hydrogen and $WF_6$ into said deposition chamber whereby a tungsten layer is deposited on said silicon wafer; and
    (i) patterning said tungsten layer to form a gate electrode.

2. The method of claim 1 wherein said first gas mixture comprises $H_2$ at a flow rate of between about 50 and 3,000 SCCM in an inert carrier gas at a flow rate adjusted to maintain a pressure of between about 0.3 and 10 Torr.

3. The method of claim 1 wherein said silicon wafer is heated to a temperature of between about 200 and 600° C.

4. The method of claim 1 wherein said second gas mixture comprises $H_2$ at a flow rate of between about 50 and 3,000 SCCM and $WF_6$ at a flow rate of between about 3 and 300 SCCM in an inert carrier gas at a flow rate adjusted to maintain a pressure of between about 10 and 100 Torr.

5. The method of claim 1 wherein said tungsten layer is between about 150 and 250 nm thick.

6. The method of claim 1 wherein said plasma enhanced chemical vapor deposition reactor is a high density plasma reactor.

7. The method of claim 1 wherein said time period is between about 2 and 10 seconds.

8. A method of forming a tungsten compound gate electrode for a self-aligned gate MOSFET on a silicon wafer comprising:
(a) providing a silicon wafer;
(b) forming a field oxide on said silicon wafer wherein said field oxide is patterned to define a silicon active area;
(c) forming a gate oxide on said active area;
(d) mounting said silicon wafer on a substrate support in a deposition chamber of a parallel plate plasma enhanced chemical vapor deposition reactor;
(e) heating said silicon wafer
(f) flowing a first gas mixture containing $H_2$, through said plasma enhanced chemical vapor deposition reactor;
(g) striking an rf glow discharge in said plasma enhanced chemical vapor deposition reactor a time period thereby forming a plasma containing active hydrogen species;
(h) after said time period, and while maintaining said glow discharge, flowing a second gas mixture containing hydrogen, $WF_6$, and a precursor gas into said deposition chamber whereby a tungsten compound layer is deposited on said silicon wafer; and
(i) patterning said tungsten compound layer to form a gate electrode.

9. The method of claim 8 wherein said first gas mixture comprises $H_2$ at a flow rate of between about 50 and 3,000 SCCM in an inert carrier gas at a flow rate adjusted to maintain a pressure of between about 0.3 and 10 Torr.

10. The method of claim 8 wherein said silicon wafer is heated to a temperature of between about 200 and 600° C.

11. The method of claim 8 wherein said second gas mixture comprises $H_2$ at a flow rate of between about 50 and 3,000 SCCM, $WF_6$ at a flow rate of between about 3 and 300 SCCM, said precursor gas at a flow rate between about 100 and 2,000 SCCM in an inert carrier gas at a flow rate adjusted to maintain a pressure of between about 0.3 and 10 Torr.

12. The method of claim 8 wherein said tungsten compound layer is between about 150 and 250 nm thick.

13. The method of claim 8 wherein said tungsten compound layer is tungsten carbide and said precursor gas is selected from the group consisting of $CH_4$, $C_2H_6$, and $C_3H_8$.

14. The method of claim 8 wherein said tungsten compound layer is tungsten nitride and said precursor gas is selected from the group consisting of $NH_3$, and $N_2$ and $C_3H_8$.

15. The method of claim 8 wherein said tungsten compound layer is tungsten silicide and said precursor gas is $SiH_4$.

16. The method of claim 8 wherein said time period is between about 2 and 10 seconds.

17. The method of claim 8 wherein said plasma enhanced chemical vapor deposition reactor is a high density plasma reactor.

18. A method of forming a contacts to silicon semiconductor devices comprising:
(a) providing a silicon wafer;
(b) forming semiconductor devices within the surface of said silicon wafer;
(c) forming an insulative layer over said semiconductor devices;
(d) etching contact openings in said insulative layer;
(e) mounting said silicon wafer on a substrate support in a deposition chamber of a parallel plate plasma enhanced chemical vapor deposition reactor;
(f) heating said silicon wafer;
(g) flowing a first gas mixture containing $H_2$, through said plasma enhanced chemical vapor deposition reactor;
(h) striking an rf glow discharge in said Plasma enhanced chemical vapor deposition reactor a time period thereby forming a plasma containing active hydrogen species;
(i) after said time period, and while maintaining said glow discharge, flowing a second gas mixture containing hydrogen, $WF_6$, and a precursor gas into said deposition chamber whereby a tungsten compound barrier layer is deposited on said silicon wafer;
(j) flowing a third gas mixture containing hydrogen and $WF_6$ into said deposition chamber whereby a tungsten layer is deposited on said tungsten compound barrier layer; and
(k) etching said tungsten layer and said tungsten compound layer by reactive ion etching thereby forming a tungsten plug contacts.

19. The method of claim 18 wherein said first gas mixture comprises $H_2$ at a flow rate of between about 50 and 3,000 SCCM in an inert carrier gas at a flow rate adjusted to maintain a pressure of between about 0.3 and 10 Torr.

20. The method of claim 18 wherein said time period is between about 10 and 20 seconds.

21. The method of claim 18 wherein said silicon wafer is heated to a temperature of between about 200 and 600° C.

22. The method of claim 18 wherein said second gas mixture comprises $H_2$ at a flow rate of between about 50 and 3,000 SCCM, $WF_6$ at a flow rate of between about 3 and 300 SCCM, said precursor gas at a flow rate between about 100 and 2,000 SCCM in an inert carrier gas at a flow rate adjusted to maintain a pressure of between about 0.3 and 10 Torr.

23. The method of claim 18 wherein said tungsten compound layer is between about 10 and 50 nm thick.

24. The method of claim 18 wherein said tungsten compound layer is tungsten carbide and said precursor gas is selected from the group consisting of $CH_4$, $C_2H_6$, and $C_3H_8$.

25. The method of claim 18 wherein said tungsten compound layer is tungsten nitride and said precursor gas is selected from the group consisting of $NH_3$, and $N_2$.

26. The method of claim 18 wherein said tungsten compound layer is tungsten silicide and said precursor gas is $SiH_4$.

27. The method of claim 18 wherein said plasma enhanced chemical vapor deposition reactor is a high density plasma reactor.

28. The method of claim 18 further comprising forming a $WSi_2$ layer between steps i and j by flowing a fourth gas mixture containing $H_2$ at a flow rate of between about 50 and 3,000 SCCM, $WF_6$ at a flow rate of between about 3 and 300 SCCM, and $SiH_4$ at a flow rate between about 100 and 2,000 SCCM in an inert carrier gas at a flow rate adjusted to maintain a pressure of between about 0.3 and 10 Torr.

29. The method of claim 28 wherein said $WSi_2$ layer is between about 5 and 10 nm thick.

* * * * *